United States Patent
Gandhi

(12) 
(10) Patent No.: US 6,263,354 B1
(45) Date of Patent: Jul. 17, 2001

(54) REDUCED MULTIPLIER DIGITAL IIR FILTERS

(75) Inventor: Prashant P. Gandhi, Sunnyvale, CA (US)

(73) Assignee: Texas Instruments Incorporated, Dallas, TX (US)

(*) Notice: Subject to any disclaimer, the term of this patent is extended or adjusted under 35 U.S.C. 154(b) by 0 days.

(21) Appl. No.: 09/232,430

(22) Filed: Jan. 15, 1999

Related U.S. Application Data

(60) Provisional application No. 60/071,587, filed on Jan. 15, 1998.

(51) Int. Cl.[7] ................................................. G06F 17/10
(52) U.S. Cl. ............................................................ 708/320
(58) Field of Search .................................. 708/300, 301, 708/313, 319, 320, 321, 322, 323

(56) References Cited

U.S. PATENT DOCUMENTS

| | | | |
|---|---|---|---|
| 4,630,299 | * 12/1986 | Welles, II et al. | 381/4 |
| 5,031,133 | * 7/1991 | Sasaki | 708/319 |
| 5,170,369 | * 12/1992 | Rossum | 708/320 |
| 5,339,264 | * 8/1994 | Said et al. | 708/319 |
| 6,009,445 | * 12/1999 | Tsyrganovich | 708/300 |

OTHER PUBLICATIONS

Bristow–Johnson, "The Equivalence of Various Methods of Computing Biquad Coefficients for Audio Parametric Equalizers," AES, 97th Convention, 3906 (K–6), Nov. '94.

* cited by examiner

*Primary Examiner*—Chuong Dinh Ngo
(74) *Attorney, Agent, or Firm*—Dwight W. Holmbo; Wade James Brady, III; Frederick J. Telecky, Jr.

(57) ABSTRACT

The application discloses a new digital IIR filter structure which uses at least one fewer multiplier than presently available in current digital IIR filter structures. In particular, by constraining one or both endpoint values (0 and fs/2) to unity, the disclosed approach uses 2 multiply operations instead of 3 for first-order structures and 3 multiply operations instead of 4 or 5 for second-order structures. This multiplier reduction enhances the capacity of the current audio equalizer digital signal processor by 30%.

27 Claims, 4 Drawing Sheets

REDUCED MULTIPLIER DIGITAL IIR FILTERS

This application claims priority under 35 USC §119(e)(1) of provisional application numbers 60/071,587 filed Jan. 15, 1998.

BACKGROUND AND SUMMARY OF THE INVENTION

The present invention relates to digital infinite impulse response (IIR) equalizer filters.

Digital Filters

A filter, simply put, is a system which modifies certain frequencies relative to others. A digital filter exists when the sets of inputs and outputs of a given filter are digital, i.e. they can assume only a finite number of possible amplitude values. Implementation of a digital filter requires that the function that operates on the set of inputs be reduced to a computational algorithm. A structure, or network, can then be implemented to produce the function.

Digital filters are generally defined by difference equations. A difference equation for a given filter will reveal the expected characteristics of the filter, such as the frequency poles and zeros and the order of the system. IIR Filters with a single frequency pole are known as first-order filters. IIR Filters with two frequency poles are known as second-order filters. First and second order filters are the most general and utilitarian designs of digital filters. They can be combined in parallel or cascade combinations to create filters of higher orders.

Most digital filters can be implemented with a combination of addition, multiplication, and delay elements or operations. General-purpose computers, including personal computers (or "PCs") or hardware such as a digital signal processor (or "DSP") may be used to implement a digital filter with these elements. In either case, the implementation of the filter serves as the specification, that is, the manner in which it is to perform. Computers and "host DSPs" utilize this specification as an algorithm specifying use of the control unit, arithmetic unit, storage registers, and multipliers (in a host DSP) to produce the desired set of outputs. Some dedicated-DSPs (or "DSP-ASICs") use the structure as a hardware configuration specification.

DSPs

DSPs, as implemented in very-large-scale integration (or "VLSI") circuits, are ideally suited to uses which require resources beyond the abilities of general-purpose computers. Such uses include processing of large amounts of data or where manipulation of data requires a high sampling rate or higher resolution per sample. A "host DSP" is a general-purpose DSP designed to accommodate a wide range of processing applications. As such, it offers a speed increase over general-purpose computers. A DSP-ASIC is designed with a specific application in mind. Therefore, it offers a speed advantage at least comparable to a host DSP as well as size and cost advantages due to its application-specific implementation.

The design characteristics of digital filters make them well suited to implementation in a DSP. The small number of elements used to describe a digital filter, combined with their highly parallel algorithmic structure, allow digital filters to readily be put into the context of a DSP.

DSPs offer not only higher speeds and resolutions than are available with general-purpose computer implementations of digital filters, but also lower cost and less space demand. The main advantage of DSP implementation of a digital filter is that the filter elements (addition, multiplication, and delay), as opposed to a general-purpose computer, do not have to be performed in sequence. That is, the DSP implementation offers opportunities for the elements to be performed in parallel. This results in increased throughput as compared to a general-purpose computer implementing the same filter.

Frequency Shelf Filters

FIGS. 5A and 5B graphically depict the functions of frequency shelf filters. Frequency shelf filters have a frequency response of unity at either 0 or fs/2, where fs is the frequency sample rate. A low-frequency shelf filter has a frequency response of unity at fs/2 and increases (or decreases) monotonically toward 0. A high-frequency shelf filter has a frequency response of unity at 0 and increases (or decreases) monotonically toward fs/2.

Frequency shelf filters are used in digital tone processing of audio signals. FIG. 5A represents the frequency response of a low-frequency shelf filter. FIG. 5B represents the frequency response of a high-frequency shelf filter. Generally, the boost and cut responses represented in each figure are chosen to be symmetric. FIGS. 5A and 5B reflect that both low and high frequency shelf filters are tied to a frequency response of unity at one end, 0 or fs/2. Therefore, frequency shelf filters can be implemented as digital first-order or higher order IIR filters.

A digital first-order filter can be represented by the transfer function $H(z)$:

$$H(z) = \frac{b_o + b_1 z^{-1}}{1 + a_1 z^{-1}}$$

where $b_o, b_1$, and $a_1$ are filter coefficients and the term $z^{-1}$ relates to a one time-unit delay. The coefficients of a particular filter are calculated using one of several theoretical design procedures: Butterworth, Chebyshev, elliptic, etc. The design procedure produces values for the needed coefficients based on parameters for the filter such as frequency response.

In time domain, the above representation of $H(z)$ gives:

$$y(n) = b_0 x(n) + b_1 x(n-1) - a_1 y(n-1).$$

Implementation of the above difference equation as a digital filter requires 3 multiply operations and three corresponding coefficient memory elements, one for each filter coefficient, $b_0$, $b_1$, and $a_1$.

Equalizer Filters

FIG. 3 graphically depicts the functions of an equalizer. An equalizer is a digital second-order IIR filter structure that allows boosting (gain larger than unity as in curve 304) or cutting (gain smaller than unity as in curve 306) of input signal frequencies centered around some design frequency $f_0 \in (0, fs/2)$. The gain is unity at the endpoints 0 and fs/2. Thus, the equalizer frequency response function $H(e^{jw})$ must have $H(e^{j0}) = H(e^{jfs/2}) = 1$.

Equalizers such as this are routinely used in audio tone control and speaker and room equalization in products such as consumer/PC audio, video, DVD and home theaters.

The current and future applications of digital equalizers necessitate DSP capacity enhancement. That is, it would be desirable to allow more equalizer processing than is currently available without incurring extra costs or increased space demands.

FIGS. 2A and 2B, described in detail below, schematically show the direct form I (DFI-type) and direct form II (DFII-type) implementation architectures for a second order IIR digital filter. A DFI-type implementation is the network realization corresponding to a difference equation which describes a particular filter. A DFII-type, or canonical, implementation is a DFI-type implementation which uses the minimum number of delay elements required for realization of the difference equation. Note that in either implementation, a second order IIR digital filter includes 5 multiply elements or operations.

Any reduction in the number of multipliers that can be achieved in the implementation of a digital filter, even at the expense of a greater number of addition elements, is significantly advantageous. Multiply operations tend to keep the DSP very busy due to the complexity of the mathematical operation. A reduction in multipliers decreases the number of clock cycles required for the filter to produce an output. Further, as multipliers are more complex than addition elements, the monetary cost of the implementation is reduced.

Finally, the physical size of the DSP on which the digital filter is implemented can be reduced due to fewer components being needed to produce the same result. As a corollary, instead of reducing chip size, a DSP could implement more digital filters with the same number of multipliers with only slight variation to the architecture, including an increase in the number of addition elements.

Reduced Multiplier Digital Filters

The present application discloses that digital equalizer filters can be implemented with fewer multipliers. The present disclosure uses at least one fewer multiplier for first and second order filters than current solutions. The present application discloses a 2-multiplier approach to first-order digital frequency shelf filters. Further, the present application discloses a 3 multiplier approach to second-order digital e-qualization filters.

In both instances, this new filter structure uses at least one fewer multiplier than present digital equalizer structures. This multiplier reduction enhances the capacity of the current audio equalizer DSP by 30 percent. The disclosed reduction in the number of multipliers required to implement some digital IIR equalization filter provides several advantages. One advantage is that the processing capacity of the audio equalizer DSP is enhanced by reducing the computational requirements imposed by first and second order digital IIR filters. That is, the number of multiply operations for first-order structures is reduced by 33 percent and the number of multiply operations for second-order structures is reduced by 25 percent. For current and future DSPs, this multiplier-efficient structure would, as an example, enhance an 11-filter capacity DSP to at least a 14-filter capacity. This allows having the ability to provide enhanced and differentiated processing features for the same cost. For instance, instead of a 5-band stereo equalizer, the DSP can provide a 7-band stereo equalizer for substantially the same cost. Another practical advantage is that the present disclosure requires approximately 20 percent less computation in a microcode implementation of a DSP or one less multiplier in a dedicated hardware DSP and requires one fewer coefficient storage word in either case. This results in faster computational output and reduced cost.

BRIEF DESCRIPTION OF THE DRAWINGS

The disclosed inventions will be described with reference to the accompanying drawings, which show important sample embodiments of the invention and which are incorporated in the specification hereof by reference, wherein.

DETAILED DESCRIPTION OF THE PREFERRED EMBODIMENTS

The numerous innovative teachings of the present application will be described with particular reference to the presently preferred embodiment. However, it should be understood that this class of embodiments provides only a few examples of the many advantageous uses of the innovative teachings herein. In general, statements made in the specification of the present application do not necessarily delimit any of the various claimed inventions. Moreover, some statements may apply to some inventive features but not to others.

Digital Filter Architecture

In the z-domain, a digital filter function for an equalizer can be represented by the transfer function H(z) given by:

$$H(z) = \frac{b_0 + b_1 z^{-1} + b_2 z^{-2}}{1 + a_1 z^{-1} + a_2 z^{-2}}$$

where $b_0$, $b_1$, $b_2$, $a_1$, and $a_2$ are the coefficients of the filter and $z^{-1}$ and $z^{-2}$ represent delays (unit delay and two-unit delays, respectively). The time-domain expression, or difference equation, representing the output in terms of input is given by $$y(n)=b_0x(n)+b_1x(n-1)+b_2x(n-2)-a_1y(n-1)-a_2y(n-2),$$

where:

y(n)=filter output x(n)=filter input $b_0$, $b_1$, $b_2$, $a_1$, $a_2$= filter coefficients x(n−1), x(n−2)=feed forward states (i.e., delayed inputs)

y(n−1), y(n−2)=feedback states (i.e. delayed outputs)

n=time-index (discrete).

Figure 2A:
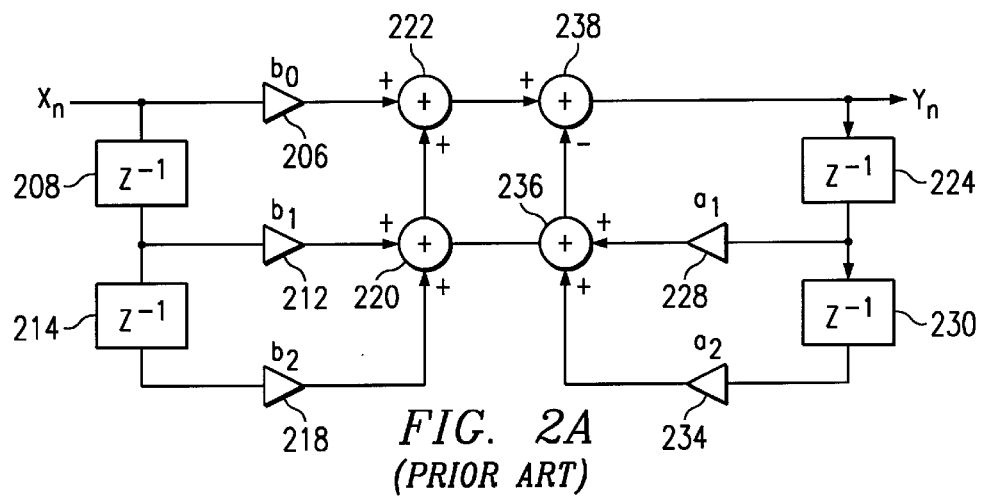
FIG. 2A schematically shows the conventional direct form I (DFI-type) implementation architecture for a second order digital IIR filter.
Figure 2B:
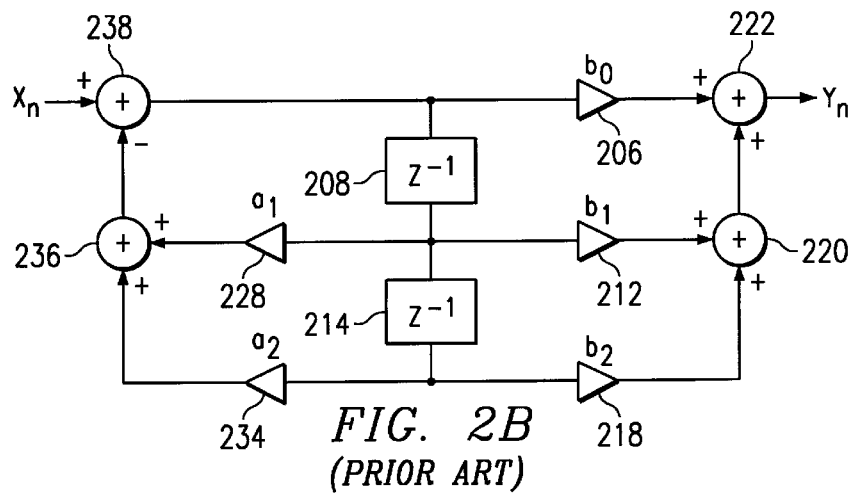
FIG. 2B schematically shows the conventional direct form II (DFII-type) implementation architecture for a second order digital IIR filter FIG. 3 graphically depicts the functions of an equalizer.
Figure 3A:
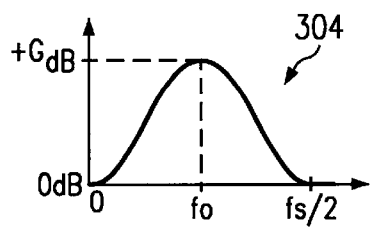
Figure 3B:
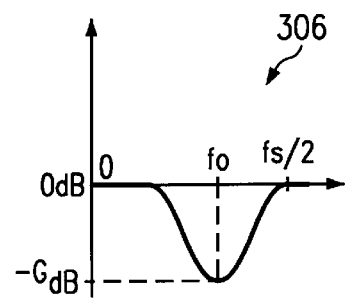

FIG. 2A schematically shows the DFI-type implementation architecture for a second order IIR digital filter difference equation above. In DFI-type, separate delays are used for the input and output signals and separate addition elements are used for each term. FIG. 2B schematically shows the DFII-type implementation architecture for a second order IIR digital filter.

In FIG. 2A, an input signal, $x_n$, is multiplied by the coefficient $b_0$ at multiplier 206. In parallel with the previous operation, an input signal that has been delayed one time unit, $x_{n-1}$, by unit delay 208 is multiplied by the coefficient $b_1$, at multiplier 212. In parallel with the previous operations, an input signal that has been delayed two time units, $X_{n-2}$, by unit delays 208 and 214 is multiplied by the coefficient $b_2$ at multiplier 218. The product of multiplier 212 is then added to the product of multiplier 218 at addition element 220. The result from addition element 220 is then added to the product of multiplier 206 at addition element 222. In parallel with the previous operations, an output signal that has been delayed by one time unit, $y_{n-1}$, by unit delay 224 is multiplied by the coefficient $a_1$ 226 at multiplier 228. In parallel with the previous operation, an input signal that has been delayed by two time units, $Y_{n-2}$, by unit delays 224 and 230 is multiplied by the coefficient $a_2$ at multiplier 234. The product of multiplier 234 is added to the product of multiplier 228 at addition element 236. The result from addition element 236 is subtracted from the result of addition element 222 at addition element 238. The result is output signal $y_n$.

In FIG. 2B, the individual elements of the above difference equation are also present. However, fewer elements are used in the implementation. An input signal, $x_n$, is multiplied by the coefficient $b_0$ at multiplier 206. In parallel with the previous operation, an input signal that has been delayed one time unit, $x_{n-1}$, by unit delay 208 is multiplied by the coefficient $b_1$, at multiplier 212. In parallel with the previous operations, an input signal that has been delayed two time units, $x_{n-2}$, by unit delays 208 and 214 is multiplied by the coefficient $b_2$ at multiplier 218. The product of multiplier 212 is then added to the product of multiplier 218 at addition element 220. The result of addition element 220 is then added to the product of multiplier 206 at addition element 222. In parallel with the previous operations, an output signal that has been delayed by one time unit, $y_{n-1}$, by unit delay 204 is multiplied by the coefficient a, at multiplier 228. In parallel with the previous operation, an input signal that has been delayed by two time unit, $y_{n-2}$, by unit delays 204 and 214 is multiplied by the coefficient $a_2$ at multiplier 234. The product of multiplier 234 is added to the product of multiplier 228 at addition element 236. The result from addition element 236 is subtracted from the result of addition element 222 at addition element 238. The result is output signal $y_n$.

Implementation of the above difference equation as a digital filter requires 5 multiply operations and three corresponding coefficient memory elements, one for each filter coefficient, $b_0$, $b_1$, $b_2$, $a_1$, and $a_2$. However, one method exists which reduces this number to 4.

Unit delays 208, 214, 224, and 230 provide a way for past values of input, output, and intermediate values within the filter to be made available. The time length of a unit delay is the time required to add one sample. For a k-bit sample added with a bit-serial adder, a one-unit delay represents k clock cycles. For samples added with a bit-parallel adder, a one-unit delay represents one clock cycle.

Overview

Figure 6A:
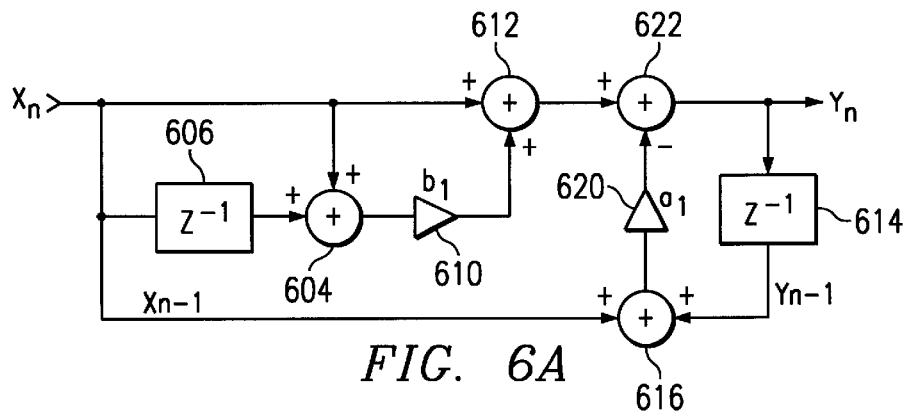
FIG. 6A schematically shows a DFI-type signal flow diagram of a first-order digital IIR low-frequency shelf filter with one fewer multiplier.
Figure 6B:
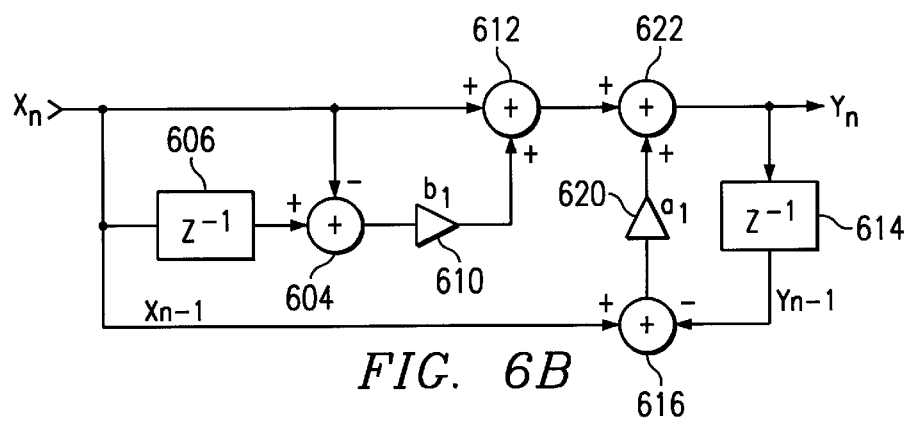
FIG. 6B schematically shows a DFI-type signal flow diagram of a first-order digital IIR high-frequency shelf filter with one fewer multiplier.

FIGS. 6A and 6B show the innovative first-order digital IIR low-frequency and high-frequency shelf filters, respectively, with one fewer multiplier. Current DFI-type and DFII-type implementations of first-order digital IIR filters require 3 multipliers. However, when constrained to operate as a high or low frequency shelf filter, the innovation requires only 2. This innovative filter requires two extra addition elements when compared to other first-order filter implementations However, addition for multiplication trade off is desirable as an addition element is much cheaper, both in terms of monetary cost and system resources, to implement (in microcode or dedicated hardware) than a multiplier.

Figure 1:
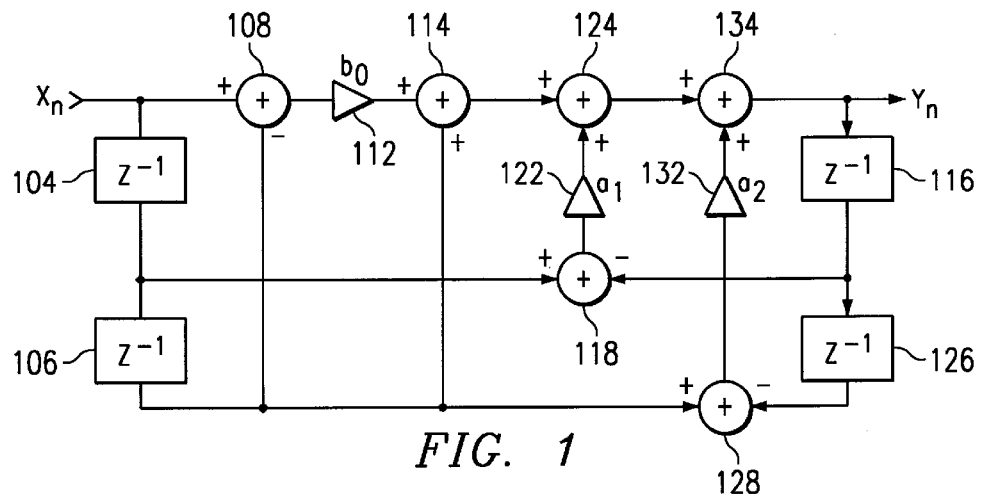
FIG. 1 schematically shows a DFI-type signal flow diagram of a 3-multiplier second-order digital IIR filter.

FIG. 1 shows a sample implementation of the innovative 3-multiplier second-order bi-quad equalizer digital IIR filter. FIG. 1, like FIGS. 2A and 2B, is a second-order digital IIR filter. However, fewer multipliers are used to implement the digital filter of FIG. 1 when compared to FIGS. 2A and 2B. That is, 3 multipliers are used instead of 5. This innovative filter requires two extra addition elements when compared to the filter implementation of FIGS. 2A and 2B. However, addition for multiplication trade off is desirable as an addition element is much cheaper, both in terms of monetary cost and system resources, to implement (in microcode or dedicated hardware) than a multiplier.

Detailed Discussion

First-Order Shelf Digital IIR Filter With One Fewer Multiplier

The digital IIR filter structure for first-order filters, generally requires three multipliers. However, when constrained to operate as a shelf filter, the complexity of the implementation can be reduced to require only two multipliers.

A digital first-order IIR filter is represented by the transfer function H(z):

$$H(z) = \frac{b_0 + b_1 z^{-1}}{1 + a_1 z^{-1}}$$

Figure 5A:
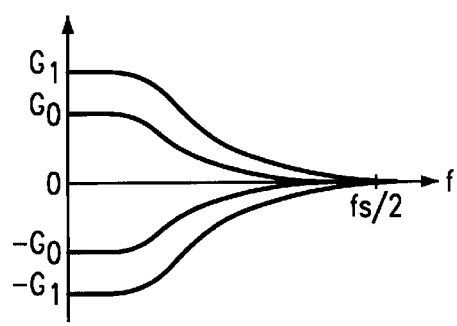
FIG. 5A graphically depicts the functions of a low-frequency shelf filter.
Figure 5B:
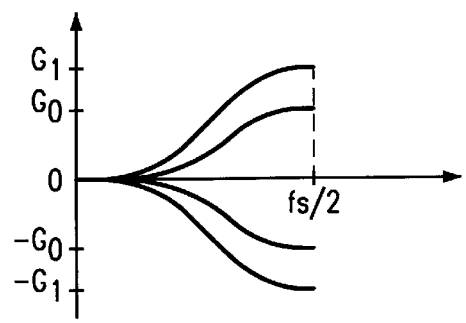
FIG. 5B graphically depicts the functions of a high-frequency shelf filter.

FIGS. 5A and 5B graphically depict first-order shelf response (boost or cut) for low-frequency and high-frequency shelf filters. For the low-frequency shelf, $H_{LF}(Z)$, the transfer function is represented by:

$$H_{LF}(z)|_{z=-1} = H_{LF}(e^{jw})|_{w=2\pi*fs/2} = 1$$

whereas, for the high-frequency shelf, $H_{HF}(Z)$, the transfer function is represented by:

$$H_{HF}(z)|_{z=1} = H_{HF}(e^{jw})|_{w=0} = 1$$

Therefore, the difference equation which describes the low-frequency shelf implementation is represented by:

$$H(z)\Big|_{z=-1} = \frac{b_o + b_1 z^{-1}}{1 + a_1 z^{-1}}\Big|_{z=-1} = 1$$

-continued $$\Rightarrow b_o - b_1 = 1 - a_1$$

$$\Rightarrow b_o = 1 + b_1 - a_1$$

$$y_n = b_o x_n + b_1 x_{n-1} - a_1 y_{n-1}$$
$$= x_n + b_1 \{x_n + x_{n-1}\} - a_1 \{y_{n-1} + x_n\}$$

Similarly, the difference equation which describes the high-frequency shelf implementation is represented by:

$$H(z)\bigg|_{z=1} = \frac{b_o + b_1 z^{-1}}{1 + a_1 z^{-1}}\bigg|_{z=-1} = 1$$

$$\Rightarrow b_o + b_1 = 1 + a_1$$

$$\Rightarrow b_o = 1 + a_1 - b_1$$

$$y_n = b_o x_n + b_1 x_{n-1} - a_1 y_{n-1}$$
$$= x_n + b_1 \{x_{n-1} - x_n\} + a_1 \{x_n - y_{n-1}\}$$

In the case of both the low-frequency shelf and the high-frequency shelf, the output of the filter, $y_n$, is obtained using two multiply operations with coefficients $b_1$, and $a_1$, FIGS. 6A and 6B schematically depict signal flow diagrams for the above time-domain representations of the low and high frequency shelf filters, respectively.

In FIG. 6A, the implementation of the difference equation for a first-order low-frequency shelf filter is shown in signal flow diagram form. The input signal $x_n$ is added, at addition element 604 to an input signal that has been delayed one time unit, $x_{n-1}$, by unit delay 606 and multiplied by the coefficient $b_1$, at multiplier 610. The product is then added to the input signal, $x_n$, at addition element 612. In parallel with the previous operations, the input signal, $x_n$, is added to an output signal that has been delayed one time unit, $y_{n-1}$, by unit delay 614 at addition element 616. The result is multiplied by coefficient $a_1$, at multiplier 620. The product is subtracted from the result of addition element 612 at addition element 622. The result is output signal $y_n$.

In FIG. 6B, the implementation of the difference equation for a first-order high-frequency shelf filter is shown in signal flow diagram form. The input signal, $x_n$, is subtracted, at addition element 604 from an input signal that has been delayed one time unit, $x_{n-1}$, by unit delay 606 and multiplied by the coefficient $b_1$, at multiplier 610. The product is then added to the input signal, $x_n$, at addition element 612. In parallel with the previous operations, an output signal that has been delayed one time unit, $y_{n-1}$, by unit delay 614 is subtracted from the input signal, $x_n$, at addition element 616. The result is multiplied by coefficient $a_1$ at multiplier 620. The product is added to the result of addition element 612 at addition element 622. The result is output signal $y_n$.

Alternatively, $b_1 = b_0 + a_1 - 1$ or $b_1 = 1 + a_1 - b_0$ may be chosen as substitutes in the low and high frequency shelf difference equations, respectively. This yields a difference equation of $$y_n = b_0(x_n + x_{n-1}) - x_{n-1} - a1(y_{n-1} - x_{n-1})$$

for the low-frequency shelf filter, and $$y_n = b_0(x_n - x_{n-1}) + x_{n-1} - a_1(y_{n-1} - x_{n-1})$$

for the high-frequency shelf filter.

Figure 7A:
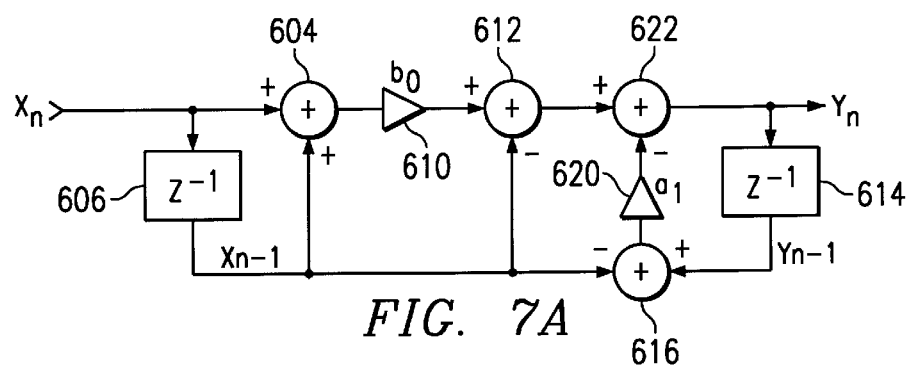
FIG. 7A schematically shows an alternative DFI-type signal flow diagram of a first-order digital IIR low-frequency shelf filter with one fewer multiplier.

In FIG. 7A, the implementation of the alternative difference equation for a low-frequency shelf filter is shown in signal flow diagram form. The input signal, $x_n$, is added, at addition element 604 to an input signal that has been delayed one time unit, $x_{n-1}$, by unit delay 606 and multiplied by the coefficient $b_0$ 626 at multiplier 610. The one time unit delayed input signal, $x_{n-1}$, is then subtracted from the product of multiplier 610 at addition element 612. In parallel with the previous operations, the one time unit delayed input signal, $x_{n-1}$, is subtracted from an output signal that has been delayed one time unit, $y_{n-1}$, by unit delay 614 at addition element 616. The result is multiplied by coefficient $a_1$ at multiplier 620. The product is subtracted from the result of addition element 612 at addition element 622. The result is output signal $y_n$.

Figure 7B:
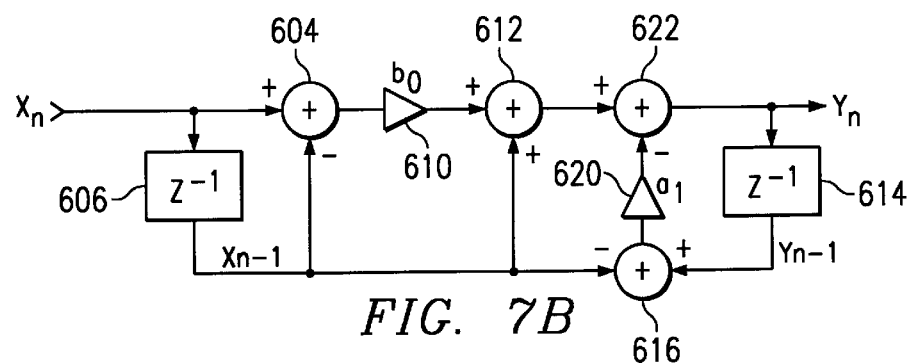
FIG. 7B schematically shows an alternative DFI-type signal flow diagram of a first-order digital IIR high-frequency shelf filter with one fewer multiplier.

In FIG. 7B, the implementation of the alternative difference equation for a high-frequency shelf filter is shown in signal flow diagram form. An input signal that has been delayed one time unit by unit delay 606 is subtracted from the input signal, $x_n$, at addition element 604 to and multiplied by the coefficient $b_0$ at multiplier 610. The one time unit delayed input signal, $x_{n-1}$, is then added to the product of multiplier 610 at addition element 612. In parallel with the previous operations, the one time unit delayed input signal, $x_{n-1}$, is subtracted from an output signal that has been delayed one time unit, $y_{n-1}$, by unit delay 614 at addition element 616. The result is multiplied by coefficient $a_1$, at multiplier 620. The product is subtracted from the result of addition element 612 at addition element 622. The result is output signal $y_n$.

The computation and memory requirements for current first order shelf filters and the innovative disclosed first-order shelf filters are compared in the table below:

| Filter Type | Addition elements | Multiplier elements | Coefficient Memory | State Variable Memory |
| --- | --- | --- | --- | --- |
| Current | 2 | 3 | 3 | 2 |
| Disclosed | 4 | 2 | 2 | 2 |

(FIGS. 6A, 6B, 7A, and 7B)

The same substitution procedure can be followed to accomplish a reduction in multipliers for second-order shelf response filters. For the second-order low-frequency shelf, $H_{LF}(Z)$, the transfer function is represented by:

$$H(z)\bigg|_{z=-1} = \frac{b_o + b_1 z^{-1} + b_z z^{-2}}{1 + a_1 z^{-1} + a_z z^{-2}}\bigg|_{z=-1} = 1$$

$$\Rightarrow b_o - b_1 + b_2 = 1 - a_1 + a_2$$

$$b_o = 1 - a_1 + a_2 + b_1 - b_2$$

$$y_n = x_n + b_1(x_{n-1} + x_n) + b_2(x_{n-2} - x_n) - a_1(y_{n-1} + x_n) - a_2(y_{n-2} - x_n)$$

Figure 8A:
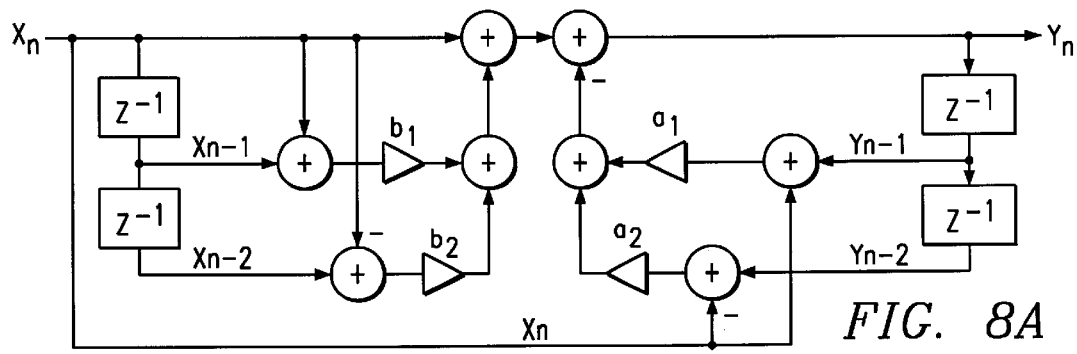
FIG. 8A schematically shows a DFI-type signal flow diagram of a second-order digital IIR low-frequency shelf filter with one fewer multiplier.

The implementation of the second-order low-frequency shelf difference equation above is schematically depicted in FIG. 8A.

Similarly, for the second-order high-frequency shelf, $H_{HF}(Z)$, the transfer function is represented by:

$$H(z)\bigg|_{z=1} = \frac{b_o + b_1 z^{-1} + b_z z^{-2}}{1 + a_1 z^{-1} + a_z z^{-2}}\bigg|_{z=1} = 1$$

$$\Rightarrow b_o + b_1 + b_2 = 1 + a_1 + a_2$$

$$b_o = 1 + a_1 + a_2 - b_1 - b_2$$

-continued $$y_n = x_n + b_1(x_{n-1} - x_n) + b_2(x_{n-2} - x_n) - a_1(y_{n-1} - x_n) - a_2(y_{n-2} - x_n)$$

Figure 8B:
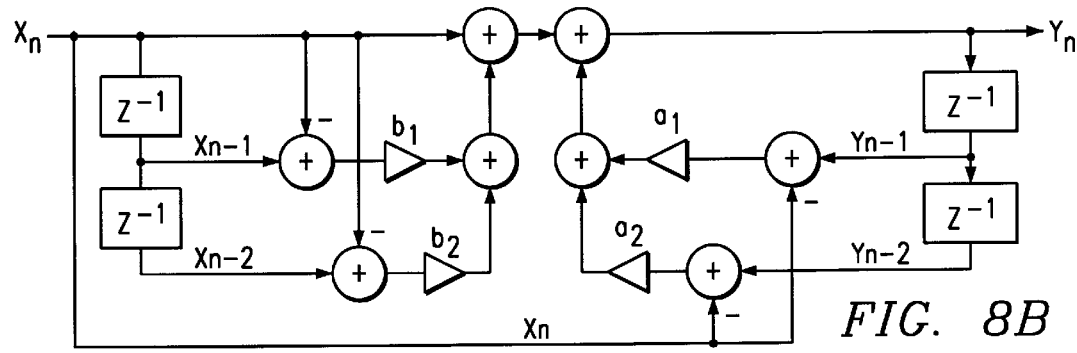
FIG. 8B schematically shows a DFI-type signal flow diagram of a second-order digital IIR high-frequency shelf filter with one fewer multiplier.

The implementation of the second-order high-frequency shelf difference equation above is schematically depicted in FIG. 8B.

The computation and memory requirements for current second-order shelf filters and the innovative disclosed second-order shelf filters are compared in the table below:

| Filter Type | Addition elements | Multiplier elements | Coefficient Memory | State Variable Memory |
|---|---|---|---|---|
| Current | 4 | 5 | 5 | 4 |
| Disclosed | 8 | 4 | 4 | 4 |

(FIGS. 8A and 8B)

Both the disclosed first and second order frequency shelf filters are implemented with fewer multipliers than current filter implementations. The disclosed implementations eliminate a multiplier and coefficient storage unit in favor of a greater number of addition operations while producing the same output. Any reduction in multiply operations, even at the expense of a greater number of addition elements is highly desirable. The benefit is substantial when multiple such filter structures are to be implemented in one DSP.

3-Multiplier Second-Order Digital IIR Bi-Quad Equalizer Filter

The two fundamental conditions on a bi-quad equalizer, i.e. $H(e^{jw})$ with $w=0$ or $2\pi fs/2$, imply that the transfer function $H(z)$, with $z=e^{jw}$, must satisfy:

$$H(z)|_{z=1 \text{ or } -1} = 1$$

In other words:

$$H(z=1) = \frac{b_0 + b_1 + b_2}{1 + a_1 + a_2} = 1;$$

$$H(z=-1) = \frac{b_0 - b_1 + b_2}{1 - a_1 + a_2} = 1$$

From this function, two equations are obtained: $b_0+b_1+b_2= 1+a_1+a_2$ and $b_0-b_1+b_2=1-a_1+a_2$.

It has been shown that $b_1=a_1$, for bi-quad equalizer filter coefficients in Robert Bristow-Johnson, THE EQUIVALENCE OF VARIOUS METHODS OF COMPUTING BI-QUAD COEFFICIENTS FOR AUDIO PARAMETRIC EQUALIZERS, 97th Convention of the Audio Engineering Society, 3906 (k-6), November 1994, which is incorporated herein by reference. Therefore, a rewriting of the above equations yields: $b_2=a_2-b_0+1$ (or $b_0=a_2-b_2+1$ or $a_2=b_0+b_2-1$). Thus, given three coefficients $b_0$, $a_1$, and $a_2$, the remaining coefficients can be obtained by simple addition (or subtraction). Substituting $b_1=a_1$, and $b_2=a_2-b_0+1$ in the time-domain equation yields:

$y(n)=b_0x(n)+b_1x(n-1)+b_2x(n-2)-a_1y(n-1)-a_2y(n-2)$, which can be rewritten as:

$y(n)=b_0\{x(n)-x(n-2)\}+x(n-2)+a_1\{x(n-1)-y(n-1)\}+a_2\{x(n-2)-y(n-2)\}$.

FIG. 1 schematically shows a DFI-type signal flow diagram which illustrates the implementation of the above difference equation using three coefficients, $b_0$, $a_1$, and $a_2$. In FIG. 1, an input signal that has been delayed two time units, $x_{n-2}$, by unit delays 104 and 106 is subtracted from the input signal $x_n$ at addition element 108 and the result is multiplied by the coefficient $b_0$ at multiplier 112. The two time unit delayed input signal, $x_{n-2}$, s then added to the product of multiplier 112 at addition element 114. In parallel with the previous operations, an output signal that has been delayed by one time unit, $y_{n-1}$, by unit delay 116 is subtracted from an input signal that has been delayed by one time unit, $x_{n-1}$, by unit delay 104 at addition element 118 and the result is multiplied by coefficient $a_1$ at multiplier 122. The product of multiplier 120 is added to the result from addition element 114 at addition element 124. In parallel with the previous operations, an output signal that has been delayed two time units, $y_{n-2}$, by unit delays 116 and 126 is subtracted from the two time unit delayed input signal, $x_{n-2}$, at addition element 128 and the result is multiplied by the coefficient $a_2$ at multiplier 132. The product of multiplier 130 is added to the result of addition element 134. The result is output signal $y_n$.

Other equivalent representations are possible as well. For example: $b_0=a_2-b_2+1$ or $a_2=b_0+b_2-1$ can be substituted into the difference equation instead of $b_2=a_2-b_0+1$. This will yield a digital filter with an equivalent output, $y_n$ of the filter described in FIG. 1. The architecture may vary but the number of multipliers will remain constant.

The computation and memory requirements for current second-order bi-quad equalizer digital IIR filters and the innovative disclosed second-order bi-quad equalizer digital IIR filter are compared in the table below:

| Filter Type | Addition elements | Multiplier elements | Coefficient Memory | State Variable Memory |
|---|---|---|---|---|
| Current | 4 | 5 | 4 | 4 |
| Disclosed | 5 | 3 | 3 | 4 |

(FIG. 1)

The disclosed second-order bi-quad equalizer digital IIR filter is implemented with fewer multipliers than current filter implementations of the same type and order. The disclosed implementations do require a greater number of addition operations to account for the reduced multipliers and coefficient storage demands. However, for a 24-bit coefficient, a multiplier implemented in add-shift architecture would require 12 addition operations. Replacement of such a multiplier by an addition element would save 11 addition operations. Therefore, any reduction in multiply operation, even at the expense of a greater number of addition elements is highly desirable. The benefit is substantial when multiple such filter structures are to be implemented in one DSP.

Figure 4:
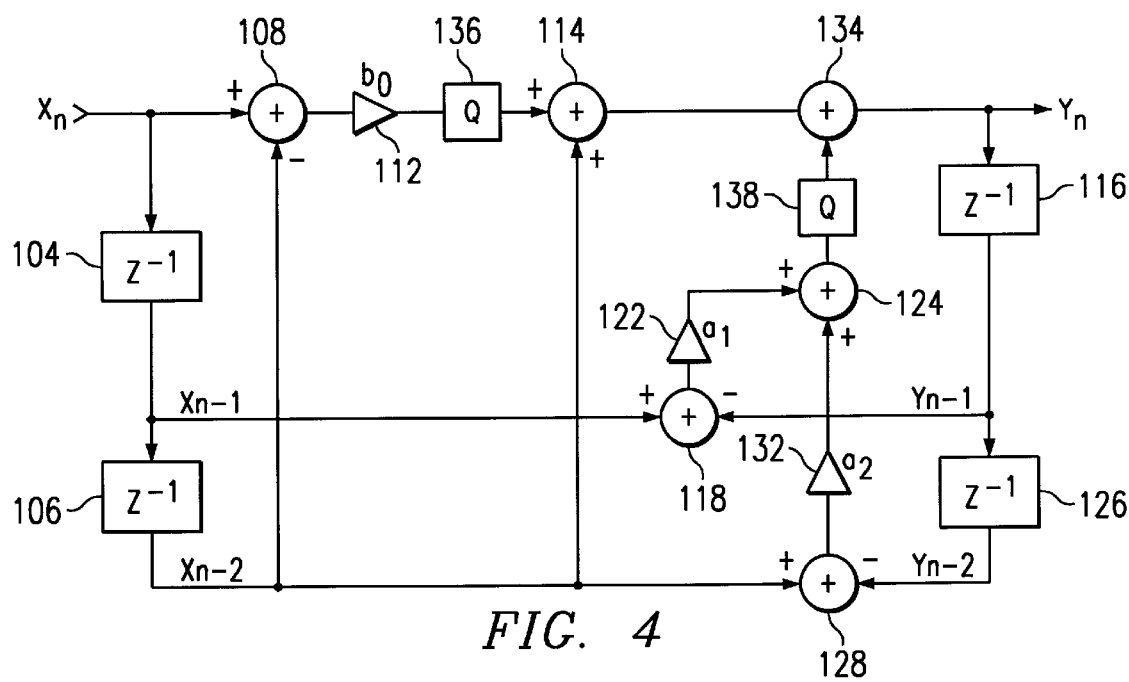
FIG. 4 schematically shows a DFI-type signal flow diagram of the 3 multiplier second-order digital IIR equalizer filter with quantization.

FIG. 4 schematically depicts the DFI-type signal flow diagram of the 3 multiplier second-order digital IIR equalizer filter of FIG. 1, with a quantization step. The signal flow of FIG. 1 is altered slightly to take account of the quantization steps. In FIG. 4, an input signal that has been delayed two time units, $x_{n-2}$, by unit delays 104 and 106 is subtracted from the input signal $x_n$ at addition element 108 and the result is multiplied by the coefficient $b_0$ at multiplier 112. The result is then quantized at quantizer 136. The two time unit delayed input signal, $x_{n-2}$, is then added to the product of multiplier 112 at addition element 114. In parallel with the previous operations, an output signal that has been delayed by one time unit, $y_{n-1}$, by unit delay 116 is subtracted from an input signal that has been delayed by one time unit, $x_{n-1}$, by unit delay 104 at addition element 118 and the result is multiplied by coefficient $a_1$, at multiplier 122. In parallel with the previous operations, an output signal that has been delayed two time units, $y_{n-2}$, by unit delays 116 and 126 is subtracted from the two time unit delayed input signal, $x_{n-2}$, at addition element 128 and the result is multiplied by the coefficient $a_2$ at multiplier 132. The product of multiplier 130 is added to the result of the product of multiplier 120 at addition element 124. The result is then quantized at quantizer 138. The result is then added to the result of addition element 114 at addition element 134. The result is output signal $y_n$.

Figure 9:
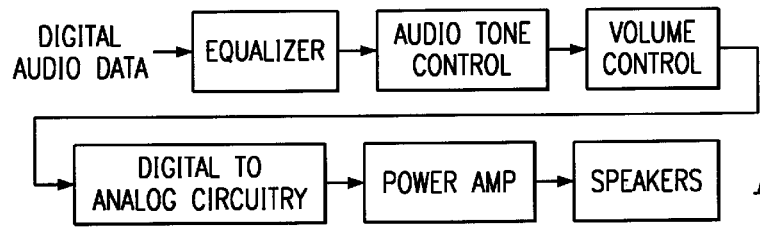
FIG. 9 depicts a block diagram of the signal processing of an audio system which utilizes the reduced multiplier digital IIR equalizer filters.

FIG. 9 depicts a block diagram of the signal processing of an audio system which utilizes the reduced multiplier digital IIR equalizer filters. An equalizer, audio tone control, and volume control are each part of a digital signal processing hardware which also includes a DSP controller, control circuitry and memory. The equalizer receives a digitized audio signal. The signal is processed by the DSP hardware. A digital to analog converter converts the signal for output as an analog audio signal which is received by a power amp and passed to the speaker system. The equalizer block utilizes 3-multiplier second-order digital IIR filters. The audio tone control block utilizes 2-multiplier frequency shelf filters.

Higher-Order Digital IIR Bi-quad Equalizer Filters

Reduction of multipliers can be achieved in filters of higher than first or second order as long as the same fundamental conditions of a bi-quad equalizer are satisfied. For example, the transfer function, H(z), of a third-order filter can be written as:

$$H(z=1) = \frac{b_0 + b_1 z^{-1} + b_2 z^{-2} + b_3 z^{-3}}{1 + a_1 z^{-1} + a_2 z^{-2} + a_3 z^{-3}} = 1;$$

$$H(z=-1) = \frac{b_0 - b_1 z^{-1} + b}{1 - a_1 a^{-1} + a_2}$$

From this function, two equations are obtained:

$b_0+b_1+b_2+b_3=1+a_1+a_2+a_3$ and $b_0-b_1+b_2-b_3=1-a_1+a_2-a_3$.

Adding the two equations yields: $b_2=1+a_2-b_0$ and subtracting the second equation from the first yields: $b_3=a_1+a_3-b_1$. Substituting these values into the time-domain equation for the filter yields:

$y(n)=b_0\{x(n)\}+b_1\{x(n-1)\}+(1a_2-b_0)\{x(n-2)\}+(a_1+a_3-b_1)\{x(n-2)\}-a_1\{y(n-1)\}-a_2\{y(n-2)\}-a_3\{y(n-3)\}$, which can be rewritten as:

$y(n)=b_0\{x(n)-x(n-2)\}+b_1\{x(n-1)-x$ $(n-3)\}+x(n-2)+a_1\{x(n-3)-y(n-1)\}+a_2\{x(n-2)-y(n-2)\}+a_3\{x(n-3)y(n-3)\}$.

Figure 10:
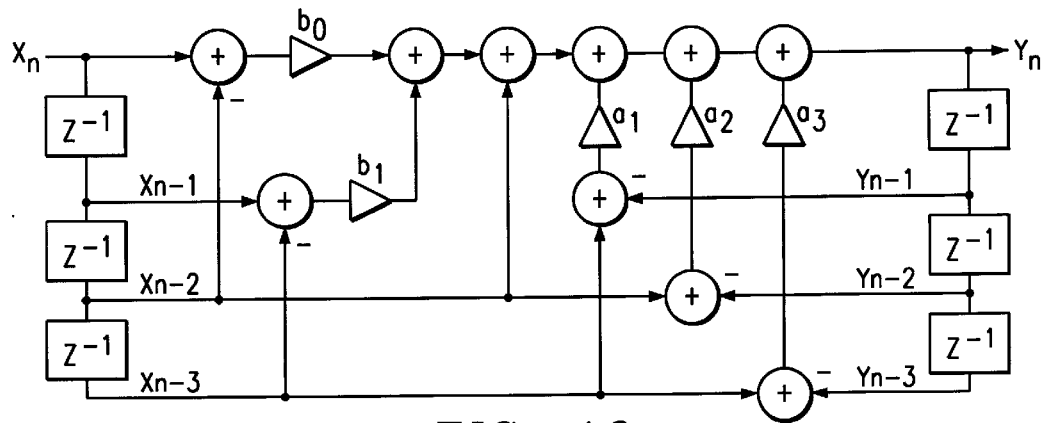
FIG. 10 schematically shows a DFI-type signal flow diagram which illustrates the implementation of a third-order difference equation using five coefficients, $b_0$, $b_1$, $a_1$, $a_2$, and $a_3$.

FIG. 10 schematically shows a DFI-type signal flow diagram which illustrates the implementation of the above difference equation using five coefficients, $b_0$, $b_1$, $a_1$, $a_2$, and $a_3$. Other equivalent representations of this third-order filter as well as filters of higher order are possible.

According to a disclosed class of innovative embodiments, there is provided a digital filter architecture, implementing a desired transfer function which has at least one constrained endpoint value with a reduced number of multipliers, comprising: one or more chains of delay stages; a plurality of multiplier stages, consisting of less than $2j+1$ multiplier stages in all; and a plurality of addition stages, interconnected with said multiplier stages and said delay stages which are no more than j samples deep, to implement a transfer function with one or more constrained endpoint values; wherein said multiplier stages implement a reduced coefficient set, which is reduced from $2j+1$ by using a priori knowledge of said constrained endpoint value of said transfer function.

According to a disclosed class of innovative embodiments, there is provided a digital filter architecture, implementing a desired transfer function which has at least two constrained endpoint values with a reduced number of multipliers, comprising: one or more chains of delay stages; a plurality of multiplier stages, consisting of exactly $2j-1$ multiplier stages in all; and a plurality of addition stages, interconnected with said multiplier stages and said delay stages which are no more than j samples deep, to implement a transfer function with one or more constrained endpoint values; wherein said multiplier stages implement a set of only $2j-1$ coefficients, which is reduced from $2j+1$ by using a priori knowledge of said constrained endpoint values of said transfer function.

According to a disclosed class of innovative embodiments, there is provided a digital IIR filter with one fewer multiplier, comprising: first and second delay chains each comprising at least two delay stages; a first addition stage connected to receive and combine the output of the intermediate node of said second delay chain and the output of the intermediate node of said first delay chain; a second addition stage connected to receive and combine the doubly delayed output of said second delay chain and the doubly delayed output of said first delay chain; a third addition stage connected to receive and combine the doubly delayed output of said first delay chain from an input signal; and a plurality of further arithmetic stages functionally connected to combine the output of said first addition stage multiplied by a first gain coefficient, the output of said second addition stage multiplied by a second gain coefficient, the output of said third addition stage multiplied by a third gain coefficient, and the doubly delayed output of said first delay chain; wherein said input signal is connected to an input of said first chain of delays and the output of said further stages is connected to an input of said second delay chain and also connected to provide an output signal.

According to a disclosed class of innovative embodiments, there is provided a digital IIR filter with one fewer multiplier, comprising: first and second delay chains each comprising at least one delay stage; a first addition stage connected to receive and combine the output of said second delay chain with an input signal; a second addition stage connected to receive and combine the output of said first delay chain and said input signal; and a plurality of further arithmetic stages functionally connected to combine the output of said first addition stage multiplied by a first gain coefficient, the output of said second addition stage multiplied by a second gain coefficient, and said input signal; wherein said input signal is connected to an input of said first chain of delays and the output of said further stages is connected to an input of said second delay chain and also connected to provide an output signal.

According to a disclosed class of innovative embodiments, there is provided a digital IIR filter with one fewer multiplier, comprising: first and second delay chains each comprising at least one delay stage; a first addition stage connected to receive and combine the output of said first delay chain and said second delay chain; a second addition stage connected to receive and combine an input signal and the output of said first delay chain; and a plurality of further arithmetic stages functionally connected to combine the output of said first addition stage multiplied by a first gain coefficient, the output of said first delay chain, and the output of said second addition stage multiplied by a second gain coefficient; wherein said input signal is connected to an input of said first chain of delays and the output of said further stages is connected to an input of said second delay chain and also connected to provide an output signal.

According to a disclosed class of innovative embodiments, there is provided a programmable system comprising: at least one programmable processor and numeric hardware which is programmed to perform: one or more delay chain operations; a plurality of multiply operations, consisting of less than 2j +1 multiply operations in all; and a plurality of additions, interconnected with said multiply operations and with delay chain operations which are no more than j samples deep, to implement a transfer function with one or more constrained endpoint values; wherein said multiply operations implement a coefficient set, which is reduced from 2j+1 by using a priori knowledge of said constrained endpoint value of said transfer function.

According to a disclosed class of innovative embodiments, there is provided an audio system comprising: an audio source; a primp; a digital equalizer comprising: one or more chains of delay stages; a plurality of multiplier stages, consisting of less than 2j +1 multiplier stages in all; and a plurality of addition stages, interconnected with said multiplier stages and with delay stages which are no more than j samples deep, to implement a transfer function with one or more constrained endpoint values; wherein said multiplier stages implement a reduced coefficient set, which is reduced from 2j +1 by using a priori knowledge of said constrained endpoint value of said transfer function; a power amp; and speakers.

According to a disclosed class of innovative embodiments, there is provided a method of digital IIR filtering with a reduced number of multiplies, implementing a desired transfer function of order j which has at least one endpoint value constraint, comprising the steps of: delaying digital signals for no more than j samples; and performing a plurality of addition operations and less than 2j +1 multiply operations, which in combination with said delaying step implement said transfer function with a coefficient set which is reduced from 2j +1 by using a priori knowledge of said endpoint constraint.

Modifications and Variations

As will be recognized by those skilled in the art, the innovative concepts described in the present application can be modified and varied over a tremendous range of applications, and accordingly the scope of patented subject matter is not limited by any of the specific exemplary teachings given, but is only defined by the issued claims.

For example, the reduced multiplier filter, although primarily for audio/video applications, can be utilized in any application with the constraint that the frequency response be unity at fs/2, 0, or both. This corresponds to a z-domain unity at 1, −1, or both. With a frequency response of unity at either fs/2 or 0, the reduction of one multiplier is achieved. With a frequency response of unity at both fs/2 and 0, the reduction of two multipliers is achieved.

For another example, the reduced multiplier filter is not limited to just first and second-order filters. Filters of higher-order can make use of the reduced multiplier filter as long as the above constraints are met.

Several implementation structures exist for digital filters. The DFI-type and DFII-type structures are derived from difference equations. However, the reduction in multipliers is not limited to DFI-type or DFII-type structures. Structures which are developed directly from a system function may also take advantage of the reduction in multipliers. Moreover, other approaches, such as those based on state-variable representations and linear transformations or on digital emulation of analog filters may also take advantage of the reduction in multipliers.

Further details of the system context and of options for implementation may be found in Alan V. Oppenheim and Ronald W. Schafer, DISCRETE-TIME SIGNAL PROCESSING (1989); Leland B. Jackson, DIGITAL FILTERS AND SIGNAL PROCESSING (1986); Lawrence R. Rabiner and Bernard Gold, THEORY AND APPLICATION OF DIGITAL SIGNAL PROCESSING (1975); and Alan V. Oppenheim and Ronald W. Schafer, DIGITAL SIGNAL PROCESSING (1975); all of which are hereby incorporated by reference.

What is claimed is:

1. A digital filter architecture, implementing a desired transfer function, which has at least one constrained endpoint value, with a reduced number of multipliers, comprising:

one or more chains of delay stages;

a plurality of multiplier stages, consisting of less than 2j+1 multiplier stages in all; and a plurality of addition stages, interconnected with said multiplier stages and with ones of said delay stages which are no more than j samples deep, to implement a transfer function with one or more constrained endpoint values;

wherein said multiplier stages implement a reduced coefficient set, which is reduced from 2j+1 by using a priori knowledge of said constrained endpoint value of said transfer function.

2. The method of claim 1 wherein said transfer function is a frequency shelf function.

3. The method of claim 1 wherein each said multiplier stage is a multiply operation in a programmable processor.

4. The method of claim 1 wherein each said addition stage is an addition operation in a programmable processor.

5. The method of claim 1 wherein said transfer function is a equalizer function.

6. The method of claim 1 wherein j=2.

7. The method of claim 1 comprising two said chains of delay stages.

8. The method of claim 1 wherein said addition and multiplier stages are configured in a modified DFI-type configuration.

9. A digital filter architecture, implementing a desired transfer function which has at least two constrained endpoint values with a reduced number of multipliers, comprising;

one or more chains of delay stages;

a plurality of multiplier stages, consisting of exactly 2j−1 multiplier stages in all; and a plurality of addition stages, interconnected with said multiplier stages and with ones of said delay stages which are no more than j samples deep, to implement a transfer function with one or more constrained endpoint values;

wherein said multiplier stages implement a set of only 2j−1 coefficients, which is reduced from 2j+1 by using a priori knowledge of said constrained endpoint values of said transfer function.

10. The method of claim 9 wherein each said multiplier stage is a multiply operation in a programmable processor.

11. The method of claim 9 wherein each said addition stage is an addition operation in a programmable processor.

12. The method of claim 9 wherein said transfer function is a equalizer function.

13. The method of claim 9 wherein j=2.

14. The method of claim 9 comprising two said chains of delay stages.

15. The method of claim 9 wherein said addition and multiplier stages are configured in a modified DFI-type configuration.

16. A digital IIR filter with one fewer multiplier, comprising:

first and second delay chains each comprising at least two delay stages;

a first addition stage connected to receive and combine the output of an intermediate node of said second delay chain and the output of an intermediate node of said first delay chain;

a second addition stage connected to receive and combine the doubly delayed output of said second delay chain and the doubly delayed output of said first delay chain;

a third addition stage connected to receive and combine the doubly delayed output of said first delay chain with an input signal; and a plurality of further arithmetic stages functionally connected to combine the output of said first addition stage multiplied by a first gain coefficient, the output of said second addition stage multiplied by a second gain coefficient, the output of said third addition stage multiplied by a third gain coefficient, and the doubly delayed output of said first delay chain;

wherein said input signal is connected to an input of said first chain of delays and the output of said further stages is connected to an input of said second delay chain and also connected to provide an output signal.

17. The digital filter of claim 16, wherein a first quantizing stage is connected to receive and quantize the output of said third addition stage; and a second quantizing stage is connected to receive and quantize the sum of said first and second addition and multiplier stages.

18. A digital IIR filter with one fewer multiplier, comprising:

first and second delay chains each comprising at least one delay stage;

a first addition stage connected to receive and combine the output of said second delay chain with an input signal;

a second addition stage connected to receive and combine the output of said first delay chain and said input signal; and a plurality of further arithmetic stages functionally connected to combine the output of said first addition stage multiplied by a first gain coefficient, the output of said second addition stage multiplied by a second gain coefficient, and said input signal;

wherein said input signal is connected to an input of said first chain of delays and the output of said further stages is connected to an input of said second delay chain and also connected to provide an output signal.

19. A digital IIR filter with one fewer multiplier, comprising:

first and second delay chains each comprising at least one delay stage;

a first addition stage connected to receive and combine the output of said first delay chain and said second delay chain;

a second addition stage connected to receive and combine an input signal and the output of said first delay chain; and a plurality of further arithmetic stages functionally connected to combine the output of said first addition stage multiplied by a first gain coefficient, the output of said first delay chain, and the output of said second addition stage multiplied by a second gain coefficient;

wherein said input signal is connected to an input of said first chain of delays and the output of said further stages is connected to an input of said second delay chain and also connected to provide an output signal.

20. A programmable system comprising:

at least one programmable processor and numeric hardware which is programmed to perform:

one or more delay chain operations;

a plurality of multiply operations, consisting of less than 2j+1 multiply operations in all; and a plurality of additions, interconnected with said multiply operations and with delay chain operations which are no more than j samples deep, to implement a transfer function with one or more constrained endpoint values;

wherein said multiply operations implement a coefficient set, which is reduced from 2j+1 by using a priori knowledge of said constrained endpoint value of said transfer function.

21. The method of claim 20 wherein said programmable processor is a digital signal processor.

22. An audio system comprising:

an audio source;

a preamp;

a digital equalizer comprising:

one or more chains of delay stages;

a plurality of multiplier stages, consisting of less than 2j+1 multiplier stages in all; and a plurality of addition stages, interconnected with said multiplier stages and with delay stages which are no more than j samples deep, to implement a transfer function with one or more constrained endpoint values;

wherein said multiplier stages implement a reduced coefficient set, which is reduced from 2j+1 by using a priori knowledge of said constrained endpoint value of said transfer function;

a power amp; and speakers.

23. The audio system of claim 22, wherein:

said digital equalizer comprises:

a second order digital IIR filter implementing the equation:

$y(n)=b_0\{x(n)-x(n-2)\}+x(n-2)+a_1\{x(n-1)-y(n-1)\}+a_2\{x(n-2)-y(n-2)\}$.

24. A method of digital IIR filtering with a reduced number of multiplies, implementing a desired transfer function of order j which has at least one endpoint value constraint, comprising the steps of:

(a.) delaying digital signals for no more than j samples; and (b.) performing a plurality of addition operations and less than 2j+1 multiply operations, which in combination with said delaying step implement said transfer function with a coefficient set which is reduced from 2j+1 by using a priori knowledge of said endpoint constraint.

25. The method of claim 24 wherein said transfer function is a frequency shelf function.

26. The method of claim 24 wherein j=2.

27. The method of claim 24 wherein said addition and multiplier stages are configured in a modified DFI-type configuration.

* * * * *